United States Patent
Boutami et al.

(10) Patent No.: US 10,191,217 B2
(45) Date of Patent: Jan. 29, 2019

(54) STRUCTURE FOR COUPLING A PHOTONIC CIRCUIT TO AN EXTERNAL DEVICE

(71) Applicant: Commissariat à l'Énergie Atomique et aux Énergies Alternatives, Paris (FR)

(72) Inventors: Salim Boutami, Grenoble (FR); Christophe Jany, Voreppe (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 15/677,198

(22) Filed: Aug. 15, 2017

(65) Prior Publication Data
US 2018/0059329 A1 Mar. 1, 2018

(30) Foreign Application Priority Data
Aug. 26, 2016 (FR) ..................... 16 57975

(51) Int. Cl.
*G02B 6/12* (2006.01)
*G02B 6/14* (2006.01)
*G02B 6/293* (2006.01)
*G02B 6/122* (2006.01)
*H01S 5/026* (2006.01)
(Continued)

(52) U.S. Cl.
CPC ....... *G02B 6/29331* (2013.01); *G02B 6/1228* (2013.01); *G02B 6/305* (2013.01); *H01S 5/026* (2013.01); *G02B 6/14* (2013.01); *G02B 2006/121* (2013.01); *G02B 2006/12061* (2013.01); *G02B 2006/12121* (2013.01); *G02B 2006/12147* (2013.01); *G02B 2006/12152* (2013.01); *G02B 2006/12178* (2013.01); *H01S 5/3013* (2013.01)

(58) Field of Classification Search
CPC .................................................... G02B 6/1228
See application file for complete search history.

(56) References Cited

U.S. PATENT DOCUMENTS 9,261,647 B1* 2/2016 Cox .................. G02B 6/12
2013/0170807 A1 7/2013 Hatori et al.
(Continued)

FOREIGN PATENT DOCUMENTS

GB 2 369 449 5/2002

OTHER PUBLICATIONS

French Search Report for Application No. 16/57975 dated Apr. 21, 2017.
(Continued)

*Primary Examiner* — Omar R Rojas
(74) *Attorney, Agent, or Firm* — Wolf, Greenfield & Sacks, P.C.

(57) ABSTRACT

A photonic circuit including a structure of coupling to an external device, the structure including a main waveguide and at least two secondary waveguides, each secondary waveguide having a first portion substantially parallel to the main guide arranged in the vicinity of the main guide to perform an evanescent wave coupling between the main guide and the secondary guide, the first portion extending in a second portion having an end opposite to the first portion defining a coupling surface of the secondary guide, emerging at the level of an external surface of the circuit.

14 Claims, 8 Drawing Sheets

(51) Int. Cl.
*G02B 6/30* (2006.01)
*H01S 5/30* (2006.01)

(56) References Cited

U.S. PATENT DOCUMENTS

2015/0010266 A1    1/2015  Webster et al.
2018/0017732 A1*   1/2018  Tassaert ............. G02B 6/12002

OTHER PUBLICATIONS

Nobuaki et al., A Hybrid Integrated Light Source on a Silicon Platform Using a Trident Spot-Size Converter. Journal of Lightwave Technology. Apr. 2014;32(7):1329-36.
Sisto et al., Novel spot size converter for coupling standard single mode fibers to SOI waveguides. Proceedings of the SPIE. 2016;9752. 15 pages.

* cited by examiner

STRUCTURE FOR COUPLING A PHOTONIC CIRCUIT TO AN EXTERNAL DEVICE

CROSS-REFERENCE TO RELATED APPLICATION

This application claims the priority benefit of French patent application number 16/57975, filed Aug. 26, 2016, which is hereby incorporated by reference in its entirety to the maximum extent allowable by law.

BACKGROUND

The present disclosure relates to the field of integrated optical circuits or photonic circuits, and more particularly aims at a structure for coupling a photonic circuit to an external circuit.

DISCUSSION OF THE RELATED ART

In certain applications, it may be desired to optically couple two different photonic circuits, that is, made on different chips. As an example, it may be desired to couple a laser source integrated on a first photonic chip, for example, made up of III-V semiconductor materials, with a passive photonic circuit integrated on a second chip, for example, made up of silicon.

Two methods enabling to optically couple two photonic circuits can be found in literature, evanescent wave coupling and butt coupling.

Evanescent wave coupling comprises stacking the two circuits to have, at a relatively small but non-zero distance, a portion of a first waveguide integrated in the first circuit, and a substantially parallel (but not coaxial) portion of a second waveguide integrated in the second circuit. The conditions to be respected to perform an evanescent wave coupling between two waveguides are for example described in the articles entitled "Electrically driven hybrid Si/III-V Fabry-Perot lasers based on adiabatic mode transformers" of B. Ben Bakir et al., Opt Exp 19, 10317 (2011), and "Adiabaticity criterion and the shortest adiabatic mode transformer in a coupled-waveguide system" of X. Sun et al., Opt let 34, 280 (2009). The evanescent wave coupling enables, when it is correctly performed, to obtain a good coupling performance, and in particular very low light energy losses during the signal transfer between the two circuits. This type of coupling however requires taking specific precautions on assembly of the circuits, to be able to accurately control the distance between the two parallel portions of stacked guides and the quality of the interface between the two circuits. In practice, this type of coupling is thus relatively difficult to implement.

Butt coupling comprises juxtaposing the two circuits to join, along a same optical axis, an end of a first waveguide integrated in the first circuit to an end of a second waveguide integrated in the second circuit. Examples of optical systems implementing a butt coupling between a photonic circuit and an external device are for example described in the articles entitled "Diode-laser-to-waveguide butt coupling" of P. Karioja et al., Applied optics 35, 404 (1996), and "Efficient Silicon-on-Insulator Fiber Coupler Fabricated Using 248-nm-Deep UV Lithography" of G. Roelkens et al., Photonics technology letters 17, 2613 (2005). Butt coupling is widely used, particularly in telecommunications, due to its ease of implementation. Butt coupling however has the disadvantage of being relatively sensitive to alignment errors between the two guides, and thus of providing uncertain coupling efficiencies.

There is a need for a structure for coupling a photonic circuit to an external device, such a structure overcoming all or part of the disadvantages of known structures.

SUMMARY

Thus, an embodiment provides a photonic circuit including a structure of coupling to an external device, the structure comprising a main waveguide and at least two secondary waveguides, each secondary waveguide having a first portion substantially parallel to the main guide arranged in the vicinity of the main guide to perform an evanescent wave coupling between the main guide and the secondary guide, the first portion extending in a second portion having an end opposite to the first portion defining a coupling surface of the secondary guide, emerging at the level of an external surface of the circuit.

According to an embodiment, each secondary waveguide has a tapered end on the side of its coupling surface.

According to an embodiment, the coefficients of coupling between the main guide and each of the secondary guides are substantially identical.

According to an embodiment, the first portions of the secondary guides are substantially at an equal distance from the main guide.

According to an embodiment, the coupling structure comprises four secondary guides.

According to an embodiment, the main guide has a rectangular transverse cross-section, the first portions of the four secondary guides being, in transverse cross-section, arranged around the main guide on the diagonal axes of symmetry of the main guide.

According to an embodiment, the maximum center-to-center distance between two secondary guides at the level of their coupling surfaces is substantially equal to twice the radius of the light beam propagated by each secondary guide at the level of its coupling surface.

According to an embodiment, along their first portions, the secondary guides progressively widen to reach a maximum width at the level of their second portions.

According to an embodiment, along the first portions of the secondary guides, the main guide progressively thins down.

According to an embodiment, the main guide stops before the external surface of the circuit.

According to an embodiment, the main waveguide and the secondary waveguides are made of silicon-germanium and are surrounded with silicon.

According to an embodiment, the main waveguide and the secondary waveguides are made of amorphous silicon and are surrounded with silicon oxide.

According to an embodiment, the main waveguide forms an extension of a waveguide internal to the circuit, the internal waveguide being made of crystal silicon.

According to an embodiment, the main waveguide and the secondary waveguides are made of silicon nitride and are surrounded with silicon oxide.

According to an embodiment, the circuit further comprises an integrated laser source, the main waveguide being coupled to the laser source.

The foregoing and other features and advantages will be discussed in detail in the following non-limiting description of dedicated embodiments in connection with the accompanying drawings.

BRIEF DESCRIPTIONS OF THE DRAWINGS

DETAILED DESCRIPTION

Figure 1A:
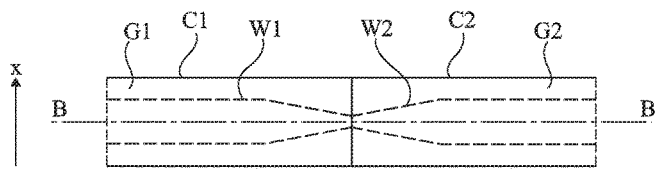
FIGS. 1A and 1B illustrate an example of a structure for coupling a photonic circuit to an external device.

The same elements have been designated with the same reference numerals in the different drawings and, further, the various drawings are not to scale. For clarity, only those elements which are useful to the understanding of the described embodiments have been shown and are detailed. In particular, in the following description, only structures of coupling of a photonic circuit to an external device are detailed. The other elements that a photonic circuit may comprise are not detailed, the described embodiments being compatible with all the usual components that can be found in a photonic circuit.

In the following description, unless otherwise indicated, when reference is made to terms qualifying absolute positions, such as terms "front", "back", "top", "bottom", "left", "right", etc., or relative positions, such as terms "above", "below", "upper", "lower", etc., or to terms qualifying directions, such as terms "horizontal", "vertical", etc., it is referred to the orientation of the drawings, it being understood that, in practice, the described structures may be oriented differently. Unless otherwise specified, expressions "approximately", "substantially", and "in the order of" mean to within 10%, preferably to within 5%, or when they refer to dimensions or angular orientations (horizontal, vertical, parallel, orthogonal, etc.) to within 10°, and preferably to within 5°.

Figure 1B:
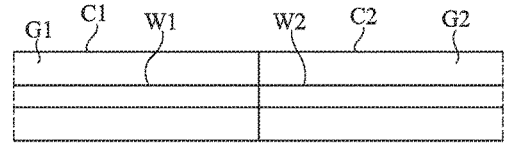

FIGS. 1A and 1B illustrate an example of a structure of coupling of a photonic circuit to an external device. More particularly, FIGS. 1A and 1B show an assembly comprising two different optically-coupled photonic circuits C1 and C2. FIG. 1A is a top view of the assembly and FIG. 1B is a longitudinal cross-section view along plane B-B of FIG. 1A.

Circuit C1 comprises a structure of coupling to an external device comprising a band-shaped waveguide W1, for example, having a rectangular transverse cross-section. Waveguide W1 is made of a first transparent material, and is surrounded with a cladding G1 made of a second transparent material having a refraction index smaller than that of the first material. Cladding G1 is in contact with the entire external surface of guide W1 except for its inlet/outlet surfaces, which correspond to the two surfaces orthogonal to the longitudinal axis of the guide. In the shown example, the longitudinal axis or optical axis of waveguide W1 is substantially horizontal. Waveguide W1 emerges at the level of a lateral surface of circuit C1, that is, one of its inlet/outlet surfaces, called coupling surface, forms a portion of a lateral surface of circuit C1. On the side of its coupling surface, waveguide W1 has a tapered end portion, that is, where its width progressively decreases to reach a minimum value at the coupling surface. In this example, waveguide W1 has a substantially constant thickness along its entire length.

In the shown example, circuit C2 comprises a substantially symmetrical coupling structure, comprising a band-shaped waveguide W2, having a coupling surface emerging at the level of a lateral surface of circuit C2, guide W2 having a tapered end on the side of its coupling surface, and being surrounded with a cladding G2 made of a material having a smaller refraction index.

The coupling between circuits C1 and C2 is a butt coupling, that is, circuits C1 and C2 are juxtaposed to place the coupling surface of waveguide W1 against the coupling surface of waveguide W2, so that the optical axes of guides W1 and W2 are confounded at the level of the coupling area.

The provision of a tapered end portion at the level of the coupling surface has the advantage of improving the tolerance to alignment errors with respect to a coupling structure having a regular transverse cross-section. Indeed, the guiding of light in the structure is performed by index contrast between region W1 (respectively W2), of higher index, and region G1 (respectively G2), of lower index. When the cross-section of guide W1 (respectively W2) progressively thins down until it disappears, one tends towards a homogeneous infinite cladding, conveying a planar wave having an infinite extension. For a small but non-zero section of guide W1 (respectively W2), a wider propagation mode (or surface of the light beam in transverse cross-section) is obtained. As a result, for a given alignment error, the decrease in the coupling coefficient due to the misalignment of guides W1 and W2 is decreased as compared with a coupling structure having a regular transverse cross-section. The coupling rate or coefficient is indeed linked to the spatial overlap integral between the two modes, taking the misalignment into account.

A limitation is that to achieve an efficient coupling, the size of the light propagation mode in guide W1 and the size of the light propagation mode in guide W2 should preferably be substantially identical at the level of the guide coupling surfaces. In practice, to be able to control the mode size at the coupling surface of the guide, the final width of the guide at the end of the taper should remain sufficiently large to be accurately controlled on manufacturing. Such a reproducibility constraint limits the accessible mode extension and thus the tolerance to alignment errors which may be obtained.

Figure 2A:
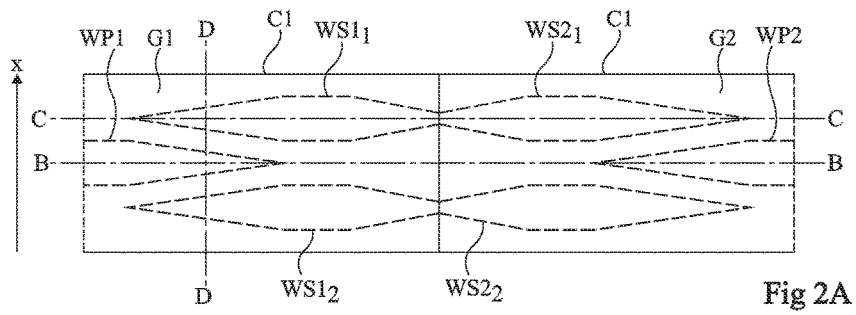
FIGS. 2A, 2B, 2C, 2D illustrate an embodiment of a structure for coupling a photonic circuit to an external device.
Figure 2B:
Figure 2C:
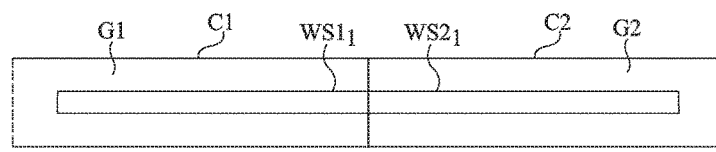
Figure 2D:
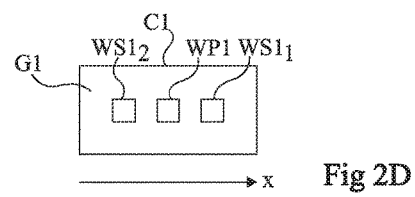

FIGS. 2A, 2B, 2C, 2D illustrate an embodiment of a structure for coupling a photonic circuit to an external device. More particularly, FIGS. 2A, 2B, 2C, 2D show an assembly comprising two different optically-coupled photonic circuits C1 and C2. FIG. 2A is a top view of the assembly, FIGS. 2B and 2C are longitudinal cross-section views along planes B-B and C-C of FIG. 2A, and FIG. 2D is a transverse cross-section view along plane D-D of FIG. 2A.

Circuit C1 comprises a structure of coupling to an external device comprising a main waveguide WP1, for example, optically coupled to another component (not shown in the drawings) of circuit C1, and two secondary waveguides $WS1_1$ and $WS1_2$, for example, substantially identical, not directly coupled to other circuit components. Main waveguide WP1 and secondary waveguides $WS1_1$ and $WS1_2$ are for example band-shaped, for example, rectilinear, for example, with rectangular transverse cross-sections (for example, square). In this example, each of guides WP1, $WS1_1$ and $WS1_2$ has a substantially constant thickness all along its length. Each of guides WP1, $WS1_1$ and $WS1_2$ is made of a first transparent material and is surrounded with a cladding made of a second transparent material having a lower refraction index. As an example, guides WP1, $WS1_1$ and $WS1_2$ are made of a same first material, and are coated in a same continuous cladding region G1 made of a second material having a lower refraction index. The optical axes of guides WP1, $WS1_1$ and $WS1_2$ are for example substantially parallel, but not confounded. In this example, the optical axes of guides WP1, $WS1_1$ and $WS1_2$ are substantially horizontal.

Each secondary guide $WS1_1$, $WS1_2$ comprises a first portion or coupling portion having an optical axis substantially parallel to the optical axis of guide WP1, arranged in the vicinity of guide WP1 to allow an evanescent wave coupling between main guide WP1 and secondary guides $WS1_1$, $WS1_2$. Secondary guides $WS1_1$, $WS1_2$ are preferably arranged so that the coupling coefficients between main guide WP1 and each of secondary guides $WS1_1$, $WS1_2$ are substantially identical. To achieve this, secondary guides $WS1_1$, $WS1_2$ may be arranged at a substantially equal distance from main guide WP1. The optical axis-to-optical axis distance between main guide WP1 and each of secondary guides $WS1_1$, $WS1_2$ is for example substantially constant all along the length of the coupling portion between main guide WP1 and secondary guides $WS1_1$, $WS1_2$. The length of the coupling portion between main guide WP1 and secondary guides $WS1_1$, $WS1_2$ and the distance between main guide WP1 and secondary guides $WS1_1$, $WS1_2$ along this coupling portion are selected to minimize coupling losses, for example, according to the teachings of the above-mentioned articles of B. Ben Bakir et al. and X. Sun et al.

In the shown example, along the coupling portion between main guide WP1 and secondary guides $WS1_1$, $WS1_2$, guide WP1 progressively thins down until it stops, while guides $WS1_1$ and $WS1_2$ progressively widen. Such layout of guides WP1 and $WS1_1$, $WS1_2$ with inverted taper shapes enables to improve the coupling between guide WP1 and guides $WS1_1$ and $WS1_2$. This layout further enables to make the coupling substantially independent from the length of the coupling portion, provided for the length of the coupling portion to be greater than a minimum value that can be determined from the teachings of the above-mentioned articles. It should be noted that the final width of the tapers formed by the ends of guides WP1, $WS1_1$ and $WS1_2$ on the side of the coupling area between guide WP1 and guides $WS1_1$ and $WS1_2$ does not need to be accurately controlled, since the tapers here do not have the function of accurately controlling the size of the modes to provide a butt coupling as in the example of FIGS. 1A and 1B, but only to ease the transfer of light energy by evanescent wave between main guide WP1 and secondary guides $WS1_1$ and $WS1_2$. Further, the described embodiments are not limited to the specific case where main guide WP1 and secondary guides $WS1_1$, $WS1_2$ have inverted taper shapes at the level of the coupling area between guide WP1 and guides $WS1_1$, $WS1_2$. As a variation, only main guide WP1 may have a tapered end, secondary guides $WS1_1$, $WS1_2$ having a regular transverse cross-section in the coupling area between guide WP1 and guides $WS1_1$, $WS1_2$. As a variation, main guide WP1 may have a regular cross-section, while secondary guides $WS1_1$, $WS1_2$ may progressively widen in the coupling area between guide WP1 and guides $WS1_1$, $WS1_2$. As a variation, the main guide and secondary guides $WS1_1$, $WS1_2$ may all have a regular cross-section in the coupling area between guide WP1 and guides $WS1_1$, $WS1_2$.

As appears in FIGS. 2A, 2B, and 2C, at the end of the coupling portion between main guide WP1 and secondary guides $WS1_1$, $WS1_2$, main guide WP1 stops, while each of secondary guides $WS1_1$, $WS1_2$ extends in a second portion emerging at the level of a lateral surface of circuit C1. In other words, each of secondary guides $WS1_1$, $WS1_2$ has an inlet/outlet surface of surface of coupling to an external device forming a portion of a lateral surface of circuit C1. As in the example described hereabove in relation with FIGS. 1A and 1B, each secondary guide $WS1_1$, $WS1_2$ has, on the side of its surface of coupling to an external device, a tapered end portion, that is, where its width progressively decreases to reach a minimum value at the coupling surface while keeping a guide width sufficiently large to be able to be repeated with a good accuracy. As an example, the width of secondary guides $WS1_1$, $WS1_2$ at the level of the coupling surface of circuit C1 is in the range from 0.1 to 0.5 μm. Preferably, the length of the tapered end is greater than 100 times the wavelength of the light intended to be transmitted by the coupling structure.

Thus, the described structure enables to optically couple main guide WP1 with an external device, by evanescent coupling between guide WP1 and guides $WS1_1$, $WS1_2$, and then by butt coupling between guides $WS1_1$, $WS1_2$ and the outer device.

In the shown example, circuit C2 comprises a substantially symmetrical coupling structure, comprising a main waveguide WP2, and two secondary waveguides $WS2_1$ and $WS2_2$ surrounded with a cladding material G2 having a smaller refraction index. Waveguides WP2, $WS2_1$ and $WS2_2$ are arranged to, on the one hand, achieve an evanescent wave coupling between main guide WP2 and secondary guides $WS2_1$ and $WS2_2$, and on the other hand, allow a butt coupling between secondary guides $WS2_1$ and $WS2_2$ and an external device, similarly to what has been described for circuit C1. The coupling between circuits C1 and C2 is a butt coupling, that is, circuits C1 and C2 are juxtaposed to place the coupling surface of guide $WS1_1$ against the coupling surface of guide $WS2_1$ and the coupling surface of guide $WS1_2$ against the coupling surface of guide $WS2_2$, so that the optical axes of guides $WS1_1$ and $WS2_1$ on the one hand, and $WS1_2$ and $WS2_2$ on the other hand, are confounded at the coupling area. The materials of elements WP2, $WS2_1$, $WS2_2$ and/or G2 of circuit C2 may be identical to the materials of the corresponding elements WP1, $WS1_1$, $WS1_2$ and/or G1 of circuit C1. As a variation, one or a plurality of elements WP2, $WS2_1$, $WS2_2$ and G2 of circuit C2 are made of different materials than the corresponding elements of circuit C1. For example, the material of cladding G2 of circuit C2 may be different from the material of cladding G1 of circuit C1, and/or the core material of secondary guides $WS2_1$ and/or $WS2_2$ of circuit C2 may be different from the core material of secondary guides $WS1_1$ and/or $WS1_2$ of circuit C1.

Figure 3A:
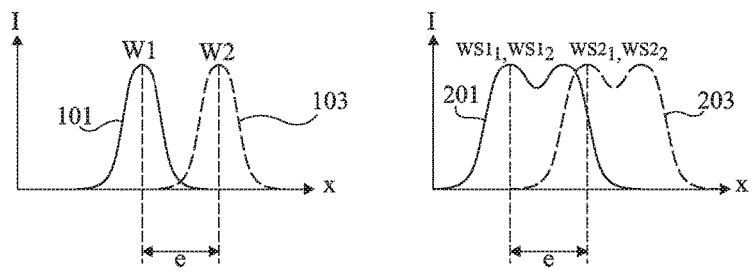
FIGS. 3A and 3B illustrate an advantage of the coupling structure of FIGS. 2A, 2B, 2C, 2D.
Figure 3B:
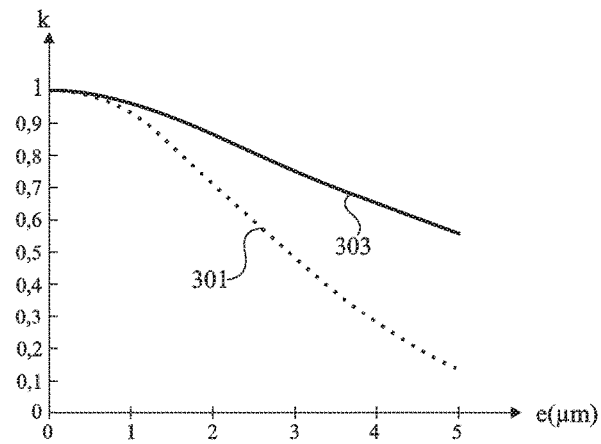

FIGS. 3A and 3B illustrate an advantage of the coupling structure of FIGS. 2A, 2B, 2C, 2D over the coupling structure of FIGS. 1A, 1B.

FIG. 3A comprises a first diagram, in the left-hand portion of the drawing, showing, for the coupling structure of FIGS. 1A, 1B, the distribution of light energy I carried by guides W1 and W2 along a direction x transverse to the guides, for example, a vertical direction in the orientation of FIG. 1A. This first diagram comprises a curve 101 in full line corresponding to the distribution of the light energy conveyed by guide W1 at the level of the coupling surface of guide W1, and a curve 103 in broken lines corresponding to the light energy conveyed by guide W2 at the level of the coupling surface of guide W2. The case where there is an alignment error e along direction x between guides W1 and W2, that is, where the optical axes or central axes of guides W1 and W2 are offset by a distance e along direction x at the coupling area, is here considered. As appears in the drawing, in this example, distributions 101 and 103 are substantially Gaussian and have substantially identical general shapes. However, due to alignment error e between guides W1 and W2, distributions 101 and 103 are not aligned. In the shown example, the overlapping area between curves 101 and 103 is very small, which results in a particularly small coefficient of coupling between guides W1 and W2.

FIG. 3A further comprises a second diagram, in the right-hand portion of the drawing, showing, for the coupling structure of FIGS. 2A, 2B, 2C, 2D, the distribution of light energy I conveyed by guides $WS1_1$ and $WS1_2$ on the one hand, and $WS2_1$ and $WS2_2$ on the other hand, along a direction x transverse to the guides, that is, a vertical direction in the orientation of FIG. 2A. This second diagram comprises a curve 201 in full line corresponding to the distribution of the light energy conveyed by guides $WS1_1$ and $WS1_2$ at the coupling surface of guide circuit C1, and a curve 203 in broken lines corresponding to the distribution of the light energy conveyed by guides $WS2_1$ and $WS2_2$ at the coupling surface of circuit C2. The case where there exists, between circuits C1 and C2, an alignment error e along direction x of same value as in the first diagram, that is, where the optical axes of guides $WS1_1$ and $WS1_2$ on the one hand, and $WS1_2$ and $WS2_2$ on the other hand, are offset by distance e along direction x at the coupling area, is here considered. As appears in the drawing, in this example, each of distributions 201 and 203 substantially corresponds to a sum of two Gaussian curves offset along axis x by a distance equal to the distance from optical axis to optical axis between guides $WS1_1$ and $WS1_2$ on the one hand (for distribution 201), and $WS2_1$ and $WS2_2$ on the other hand (for distribution 203). As a result, distributions 201, respectively 203 of the coupling structure of FIGS. 2A, 2B, 2C, 2D are much wider than distributions 101, respectively 103, of the coupling structure of FIGS. 1A, 1B. In particular, for a same alignment error e, the overlapping area between curves 201 and 203 is much greater than the overlapping area between curves 101 and 103. Thus, for a same alignment error e, the coupling coefficient between circuits C1 and C2 is greater with the coupling structure of FIGS. 2A, 2B, 2C, 2D than with the coupling structure of FIGS. 1A, 1B. The coupling structure of FIGS. 2A, 2B, 2C, 2D thus enables to increase the tolerance to alignment errors in direction x as compared with the coupling structure of FIGS. 1A, 1B.

FIG. 3B is a diagram showing the variation of coupling coefficient k (unit-less value between 0 and 1) according to alignment error e (in μm) for a coupling structure of the type described in relation with FIGS. 1A, 1B (curve 301 of FIG. 3B, in dotted lines) and for a coupling structure of the type described in relation with FIGS. 2A to 2D (curve 303 of FIG. 3B, in full line). As appears in FIG. 3B, when alignment error e increases, coupling coefficient k more strongly decreases for the structure of FIGS. 1A and 1B (curve 301) than for the structure of FIGS. 2A to 2D (curve 303). The coupling structure of FIGS. 2A to 2D thus has a better tolerance to alignment errors than the coupling structure of FIGS. 1A, 1B.

The distance between secondary guides $WS1_1$ and $WS1_2$ (respectively $WS2_1$ and $WS2_2$) at the coupling surface of circuit C1 (respectively C2) is preferably selected to be sufficiently short for the beams conveyed by the secondary guides to partially overlap at the level of the coupling surface of the structure. As an example, for a given width of the secondary guides at the coupling surface (for example, the minimum repeatable width in the considered technology), the beam conveyed by each secondary guide at its coupling surface may be assimilated to a Gaussian beam of radius R, that is, such that light intensity I at the coupling surface is defined by relation $$I = e^{-\left(\frac{x^2+y^2}{R^2}\right)},$$

x and y being the coordinates in the plane of the coupling surface of the guide, in an orthogonal reference frame centered on the optical axis of the guide. The center-to-center distance between secondary guides $WS1_1$ and $WS1_2$ at the coupling surface of the structure is for example in the range from R to 3R, and preferably in the order of 2R.

Figure 4:
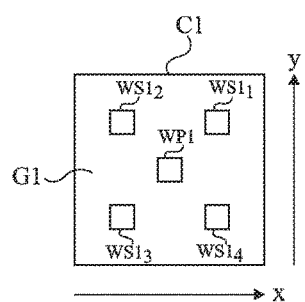
FIG. 4 illustrates an alternative embodiment of the coupling structure of FIGS. 2A, 2B, 2C, 2D.

FIG. 4 illustrates an alternative embodiment of the coupling structure of FIGS. 2A, 2B, 2C, 2D. In FIG. 4, only a transverse cross-section of circuit C1 in the same cross-section plane as that of FIG. 2D has been shown, it being understood that, in practice, the coupling structure of circuit C1 shown in FIG. 4 may be coupled to a symmetrical coupling structure of a circuit C2 similarly to what has been previously described. The structure of FIG. 4 differs from the structure of FIGS. 2A, 2B, 2C, 2D mainly in that it comprises no longer two, but four secondary guides $WS1_1$, $WS1_2$, $WS1_3$, $WS1_4$, for example, substantially identical, coupled by evanescent coupling with main guide WP1 and emerging onto a lateral surface of circuit C1. In the structure of FIG. 4, at the coupling surface of circuit C1, the optical axes of secondary guides $WS1_1$ and $WS1_3$ on the one hand, and $WS1_2$ and $WS1_4$ on the other hand define two substantially orthogonal planes. As a result, the coupling structure of FIG. 4 enables to improve the tolerance to alignment errors not only in direction x, but also in a direction y orthogonal to direction x and orthogonal to the propagation direction of light at the coupling area. In the same way as in the example of FIGS. 2A, 2B, 2C, 2D, the maximum distance between two secondary guides of the structure of FIG. 4 is preferably selected to be sufficiently short for the beams conveyed by the guides to partially overlap at the level of the coupling surface of the structure. For example, calling R the radius of the beams (assimilated to Gaussian beams) conveyed by the secondary guides at the level of the coupling surface of the structure, the maximum center-to-center distance between two secondary guides at the coupling surface may be in the order of 2R.

FIG. 4 shows a preferred configuration where guides WP1, $WS1_1$, $WS1_2$, $WS1_3$ and $WS1_4$ have a rectangular cross-section and where, at the level of the coupling area between guide WP1 and guides $WS1_1$, $WS1_2$, $WS1_3$, and $WS1_4$, guides $WS1_1$, $WS1_2$, $WS1_3$, and $WS1_4$ are placed at an equal distance from guide WP1, and are located, in transverse cross-section, respectively at the four corners of guide WP1. In other words, in the example of FIG. 4, in transverse cross-section, the optical axes of secondary guides $WS1_1$ and $WS1_3$ are located on either side of guide WP1 on a first diagonal of guide WP1, and the optical axes of secondary guides $WS1_2$ and $WS1_4$ are located on either side of guide WP1 on the second diagonal of guide WP1. An advantage of this configuration is due to the fact that, in a waveguide having a rectangular cross-section, the light is generally polarized. The arranging of the secondary guides on the diagonal axes of symmetry of the main guide enables the coupling between the main guide and the secondary guides to be achieved substantially in the same way as in the four secondary guides, that is, the coupling coefficients between the main guide and the four secondary guides are substantially the same. Such a layout is particularly advantageous when main guide WP1 has a non-square rectangular transverse cross-section, as illustrated for example in FIGS. 5I, 6C, and 7D described hereafter.

It should further be noted that as in the example of FIGS. 2A to 2D, the materials of the elements of coupling structure C2 may be different from the materials of the corresponding elements of the coupling structure of circuit C1. For example, the material of cladding G2 of circuit C2 may be different from the material of cladding G1 of circuit C1, and/or the core material of secondary guides $WS2_1$ and/or $WS2_2$ and/$WS2_3$ and/or $WS2_4$ of circuit C2 may be different from the core material of secondary guides $WS1_1$ and/or $WS1_2$ and/or $WS1_3$ and/or $WS1_4$ of circuit C1. The arranging of the secondary guides on the diagonal axes of symmetry of the main guide is particularly advantageous when, for at least one of the pairs of secondary guides located on a same diagonal, the core material and/or the cladding material of the secondary guides of the coupling structure of circuit C1 is different from the core material and/or from the cladding material of the corresponding secondary guides of the coupling structure of circuit C2.

Examples of a method of manufacturing a coupling structure of the type described hereabove will now be described.

FIGS. 5A, 5B, 5C, 5D, 5E, 5F, 5G, 5H, 5I illustrate steps of an example of a method of manufacturing a coupling structure of the type described in relation with FIG. 4.

It is considered in this example that the coupling structure is integrated in a photonic circuit using silicon-germanium (SiGe) as a high-index material and silicon (Si) as a low-index material. This type of circuit may for example be used in the mid-infrared spectral range, for example, to process optical signals having wavelengths in the range from 3 to 12 μm. As a variation, for this same wavelength range, a similar manufacturing method may be implemented to form a coupling structure using germanium as a high-index (core) material and silicon-germanium as a low-index (cladding) material.

Figure 5A:
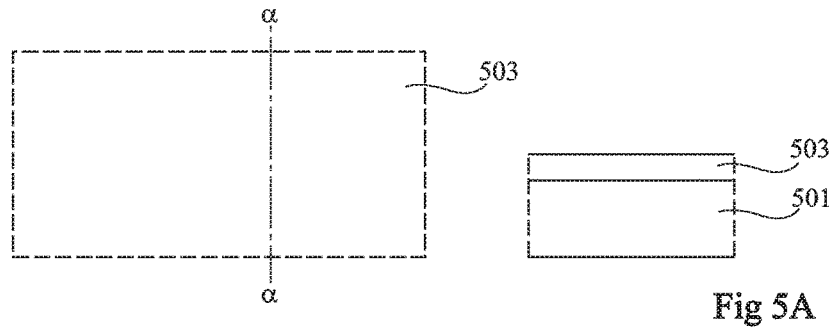
FIGS. 5A, 5B, 5C, 5D, 5E, 5F, 5G, 5H, 5I illustrate steps of an example of a method of manufacturing a coupling structure of the type described in relation with FIG. 4.

FIGS. 5A, 5B, 5C, 5D, 5E, 5F, 5G, 5H, 5I each comprise, in the left-hand portion of the drawing, a top view of the structure and, in the right-hand portion of the drawing, a cross-section view along plane α-α of FIG. 5A.

FIG. 5A illustrates an initial step during which it is started from a crystal silicon substrate 501, having a silicon-germanium layer 503 deposited, for example by epitaxy, on the upper surface thereof.

Figure 5B:
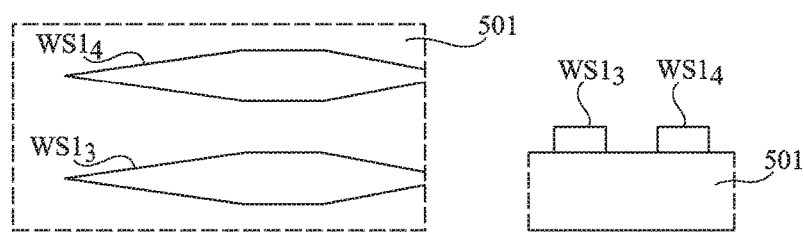

FIG. 5B illustrates a step subsequent to the step of FIG. 5A, during which lower secondary guides $WS1_4$ and $WS1_3$ of the structure of FIG. 4 are delimited in silicon-germanium layer 503, for example, by lithography and etching.

Figure 5C:
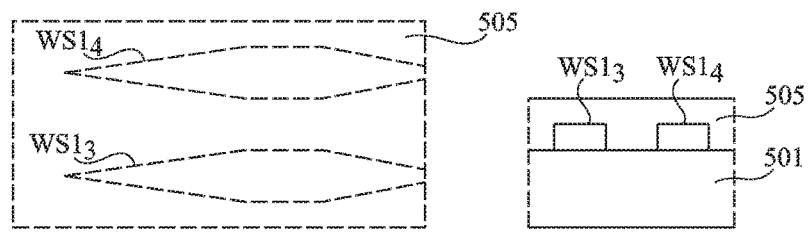

FIG. 5C illustrates a step of depositing, for example, by epitaxy, a silicon layer 505 having a thickness greater than the thickness silicon-germanium layer 503, on the upper surface of the structure obtained at the end of the step of FIG. 5B. Silicon layer 505 may then be planarized, for example, by chem.-mech. polishing (CMP). At the end of this step, silicon layer 505 fills the space laterally surrounding secondary guides $WS1_4$ and $WS1_3$ and fully covers the upper surfaces of secondary guides $WS1_4$ and $WS1_3$.

Figure 5D:
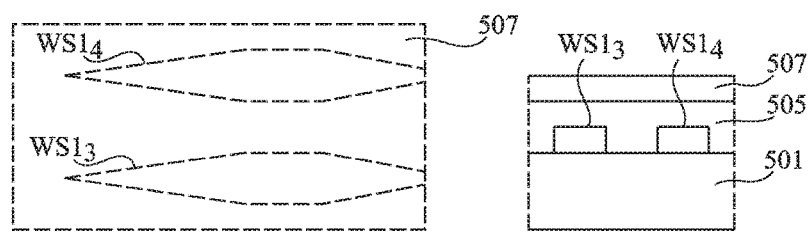

FIG. 5D illustrates a step subsequent to the step of FIG. 5C, during which a silicon-germanium 507 is deposited, for example, by epitaxy, on the upper surface of layer 505.

Figure 5E:
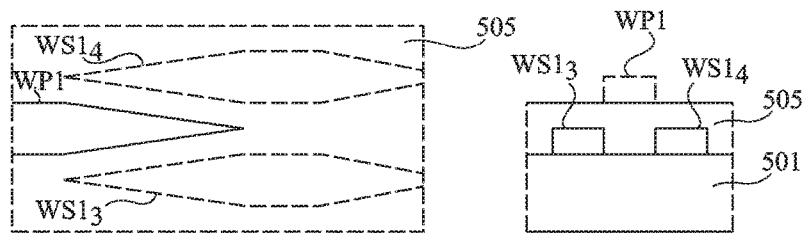

FIG. 5E illustrates a step subsequent to the step of FIG. 5D, during which main guide WP1 of the structure of FIG. 4 is delimited in silicon-germanium layer 507, for example, by lithography and etching.

Figure 5F:
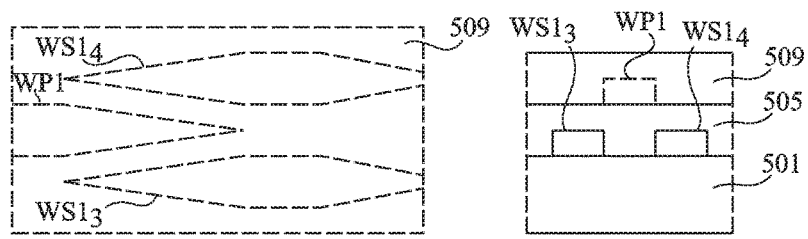

FIG. 5F illustrates a step of depositing, for example, by epitaxy, a silicon layer 509 having a thickness greater than the thickness of silicon-germanium layer 507, on the upper surface of the structure obtained at the end of the step of FIG. 5E. Silicon layer 509 may then be planarized, for example, by chem.-mech. polishing (CMP). At the end of this step, silicon layer 509 fills the space laterally surrounding main guide WP1 and fully covers the upper surface of main guide WP1.

Figure 5G:
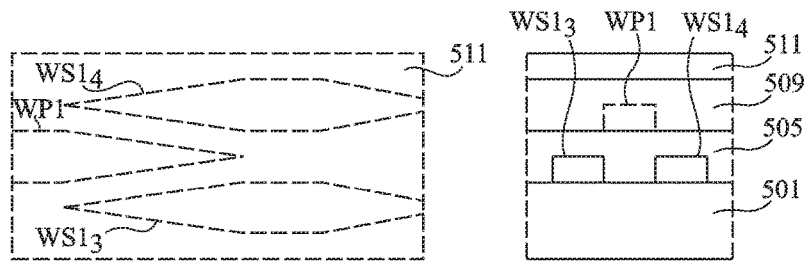

FIG. 5G illustrates a step subsequent to the step of FIG. 5F, during which a silicon-germanium layer 511 is deposited, for example, by epitaxy, on the upper surface of layer 509.

Figure 5H:
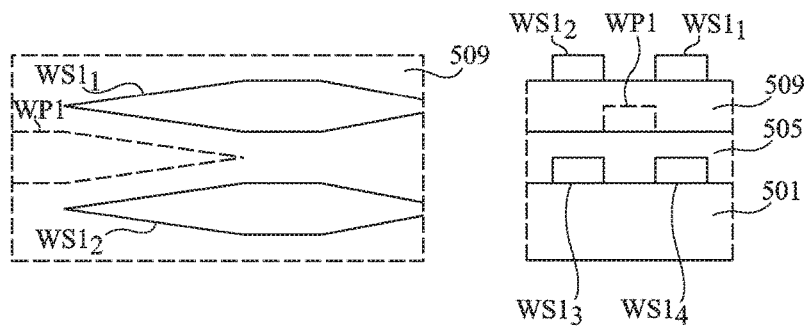

FIG. 5H illustrates a step subsequent to the step of FIG. 5G, during which upper secondary guides $WS1_1$ and $WS1_2$ of the structure of FIG. 4 are delimited in silicon-germanium layer 511, for example, by lithography and etching.

Figure 5I:
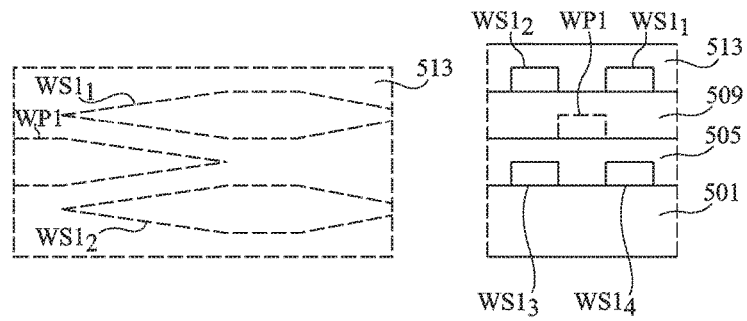

FIG. 5I illustrates a step of depositing, for example, by epitaxy, a silicon layer 513 having a thickness greater than the thickness of silicon-germanium layer 511, on the upper surface of the structure obtained at the end of the step of FIG. 5H. Silicon layer 513 may then be planarized, for example, by chem.-mech. polishing (CMP). At the end of this step, silicon layer 513 fills the space laterally surrounding secondary guides $WS1_1$ and $WS1_2$ and fully covers the upper surface of secondary guides $WS1_1$ and $WS1_2$.

At the end of the step of FIG. 5I, a coupling structure similar to that of FIG. 4 is obtained, silicon layer 501, 505, 509, and 513 forming the cladding of the material of low index G1 of the structure.

For the near infrared range, for example, for optical signals having wavelengths in the range from 0.8 to 2 μm, a similar method may be implemented by using silicon oxide as a low-index material, and amorphous silicon as a material of higher index. As a variation, for this same wavelength range or for visible light (for example, in the wavelength range from 0.3 to 0.8 μm), a similar manufacturing method may be implemented by using silicon nitride (SiN) as a high-index material and silicon oxide as a low-index material.

Figure 6A:
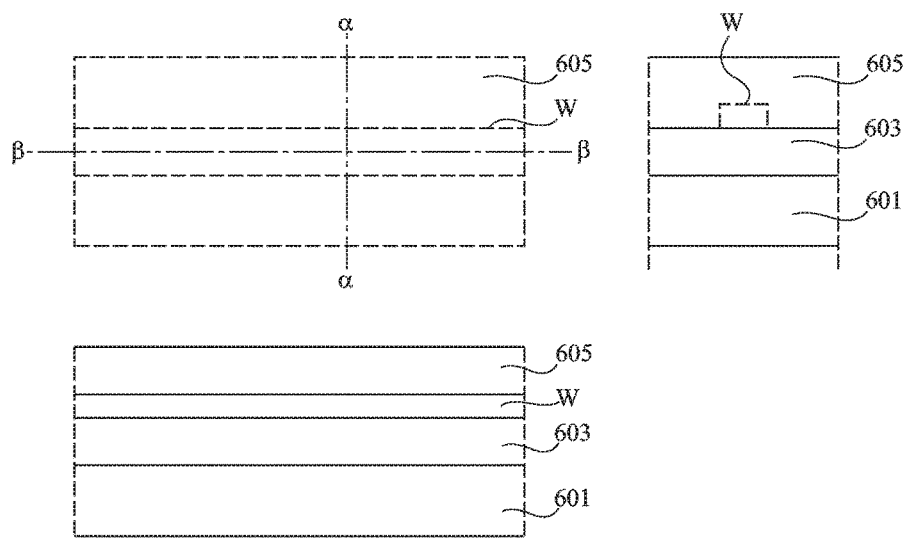
FIGS. 6A, 6B, 6C illustrate steps of another example of a method of manufacturing a coupling structure of the type described in relation with FIG. 4.
Figure 6B:
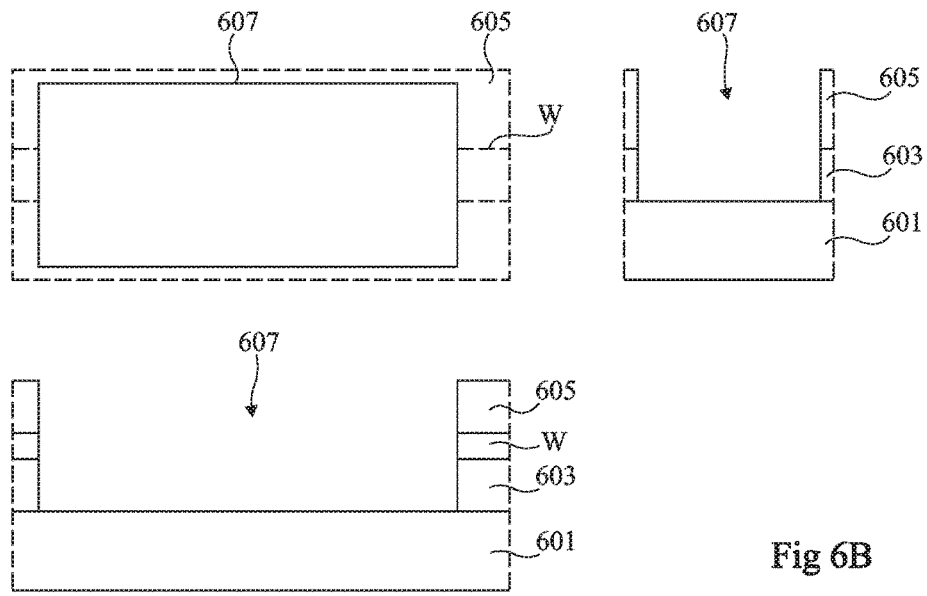
Figure 6C:
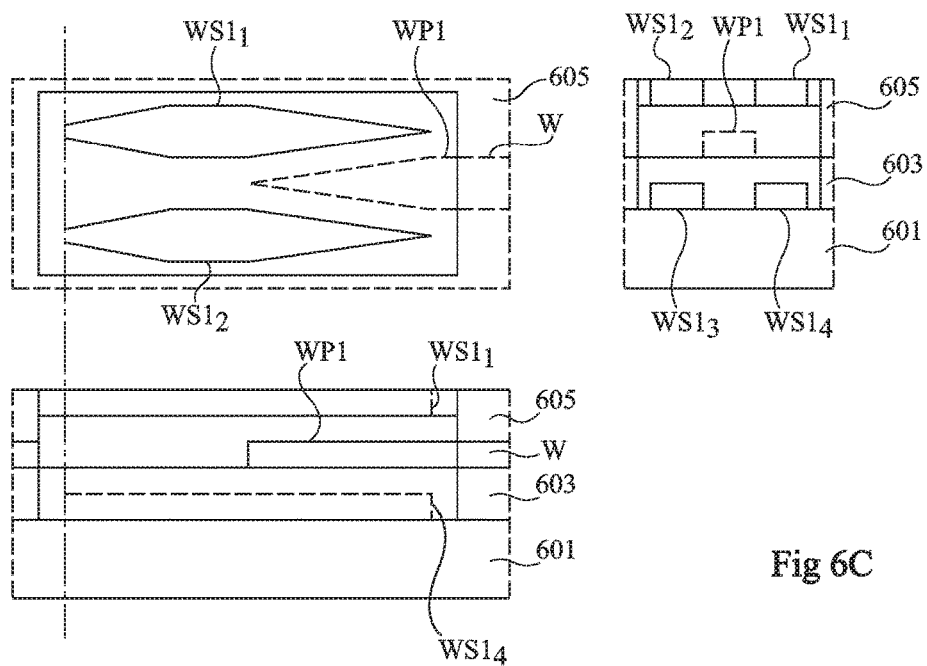

FIGS. 6A, 6B, 6C illustrate steps of another example of a method of manufacturing a coupling structure of the type described in relation with FIG. 4.

FIGS. 6A, 6B, 6C each comprise, in the upper left-hand portion of the drawing, a top view of the structure, in the upper right-hand portion of the drawing, a transverse cross-section view along plane α-α of FIG. 6A, and in the lower left-hand portion of the drawing, a longitudinal cross-section view along plane β-β of FIG. 6A.

In this example, a photonic circuit formed in SOI (silicon on insulator) technology, to which a coupling structure of the type described in relation with FIG. 4 is desired to be added, is considered.

FIG. 6A illustrates an initial structure comprising a silicon substrate 601, topped with a silicon oxide layer 603. A waveguide W internal to the photonic circuit, made of crystal silicon, is arranged on the upper surface of silicon oxide layer 603. Waveguide 603 is surrounded laterally and on its upper surface side with a planarized silicon oxide layer 605.

FIG. 6B illustrates a step of forming, from the upper surface of the structure of FIG. 6A, a cavity or recess 607 at the level of the peripheral area of the circuit where the coupling structure is desired to be formed. Cavity 607 extends in depth down to the upper surface of silicon substrate 601. Cavity 607 is located so that internal waveguide W emerges into cavity 607.

FIG. 6C illustrates a step of forming, in cavity 607, a coupling structure of the type described in relation with FIG. 4, by successive depositions of layers of silicon oxide (as a material of lower index) and of layers of amorphous silicon (as a material of higher index), for example, according to a method similar to what has been described in relation with FIGS. 5A to 5I. As a variation, the high-index material may be silicon nitride and the low-index material may be silicon oxide. In this example, it is ascertained, during this step, to align main guide WP1 of the coupling structure with internal guide W of the photonic circuit, so that guide WP1 forms an extension of internal guide W. In other words, in the shown example, a surface of internal guide W emerging into cavity 607 is placed against the surface of main guide WP1 opposite to the coupling region between main guide WP1 and secondary guides $WS1_1$, $WS1_2$, $WS1_3$, and $WS1_4$. Thus, the formed structure enables to couple internal guide W of the photonic circuit to an external device.

Once guides WP1, $WS1_1$, $WS1_2$, $WS1_3$ and $WS1_4$ of the coupling structure have been formed, the obtained structure may be cut, for example, by cleaving, according to a vertical cross-section plane running through the coupling surfaces of secondary guides $WS1_1$, $WS1_2$, $WS1_3$, and $WS1_4$, to have the coupling surfaces of secondary guides $WS1_1$, $WS1_2$, $WS1_3$, and $WS1_4$ emerge onto a lateral surface of the photonic circuit.

FIGS. 7A, 7B, 7C, 7D illustrate steps of another example of a method of manufacturing a coupling structure of the type described in relation with FIG. 4.

Figure 7A:
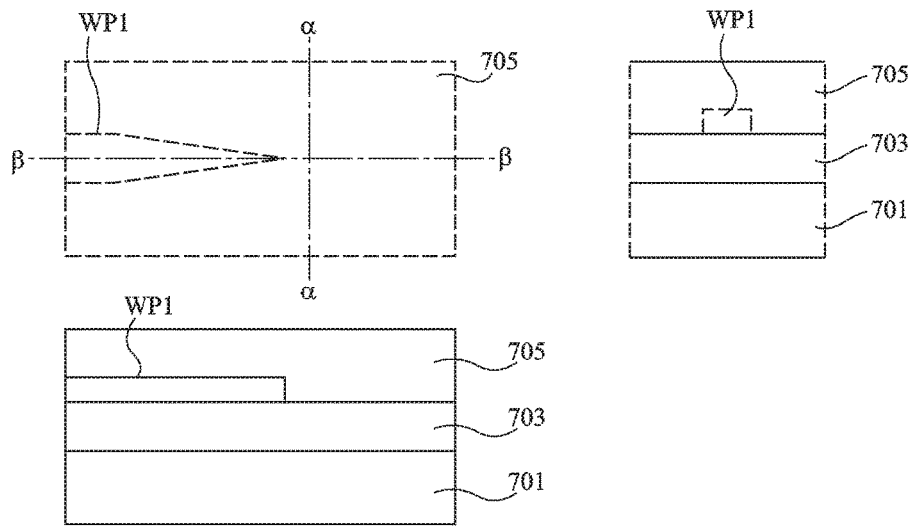
FIGS. 7A, 7B, 7C, 7D illustrate steps of another example of a method of manufacturing a coupling structure of the type described in relation with FIG. 4.

FIGS. 7A, 7B, 7C, 7D each comprise, in the upper left-hand portion of the drawing, a top view of the structure, in the upper right-hand portion of the drawing, a transverse cross-section view along plane α-α of FIG. 7A, and in the lower left-hand portion of the drawing, a longitudinal cross-section view along plane β-β of FIG. 7A.

In this example, the photonic circuit having the coupling structure formed therein is an active circuit integrating a laser source.

FIG. 7A illustrates an initial structure comprising a support substrate 701 made of indium phosphide (InP) topped with a buffer layer 703, also made of indium phosphide. Buffer layer 703 is topped with an active laser diode stack, for example, a stack of quantum wells based on indium-gallium arsenide (InGaAs), having the laser source (not shown in the drawing) of the circuit formed therein as well as, coupled to the laser source, a waveguide corresponding to main waveguide WP1 of the coupling structure. The active stack is topped with an upper indium phosphide layer 705 which surrounds waveguide WP1 laterally and on its upper surface side.

Figure 7B:
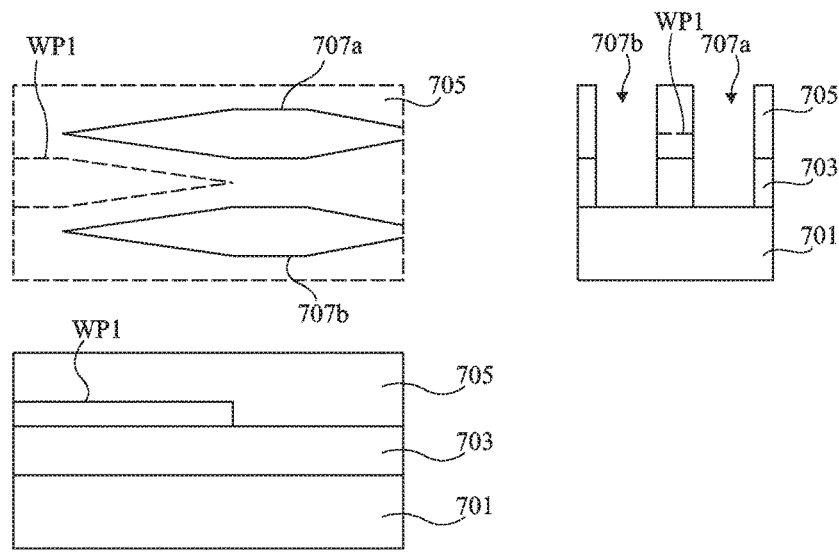

FIG. 7B illustrates a step of forming, from the upper surface of the structure of FIG. 7A, two trenches or cavities 707a and 707b vertically extending in the structure all the way to the upper surface of substrate 701. In top view, trench 707a substantially has the shape of secondary guides $WS1_1$ and $WS1_4$ of the coupling structure which is desired to be formed, and trench 707b substantially has the shape of secondary guides $WS1_2$ and $WS1_3$ of the coupling structure which is desired to be formed.

Figure 7C:
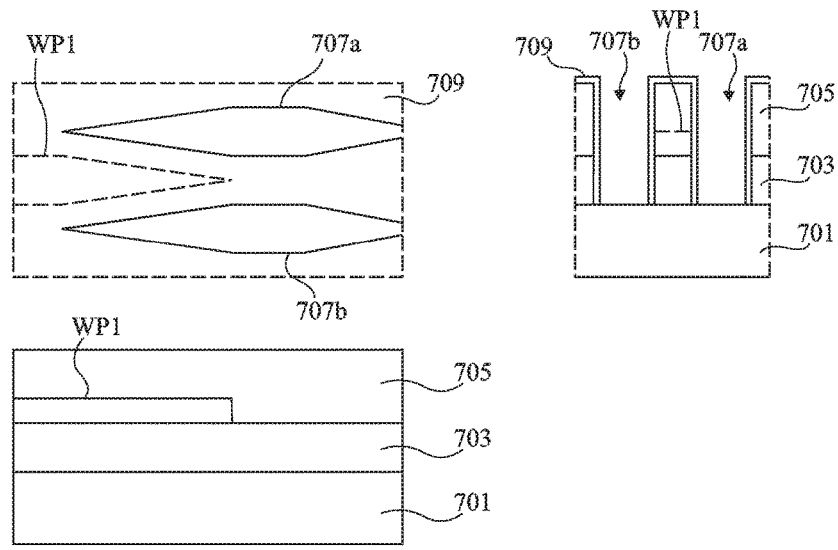

FIG. 7C illustrates a step of depositing a passivation layer 709, for example, made of silicon oxide, on the upper surface of the structure obtained at the end of the step of FIG. 7B, followed by a step of locally removing layer 709 from the bottom of trenches 707a, 707b. At the end of this step, layer 709 substantially coats the entire upper surface of the circuit, as well as the lateral walls of trenches 707a, 707b, but leaves accessible the upper surface of substrate 701 at the bottom of trenches 707a, 707b.

Figure 7D:
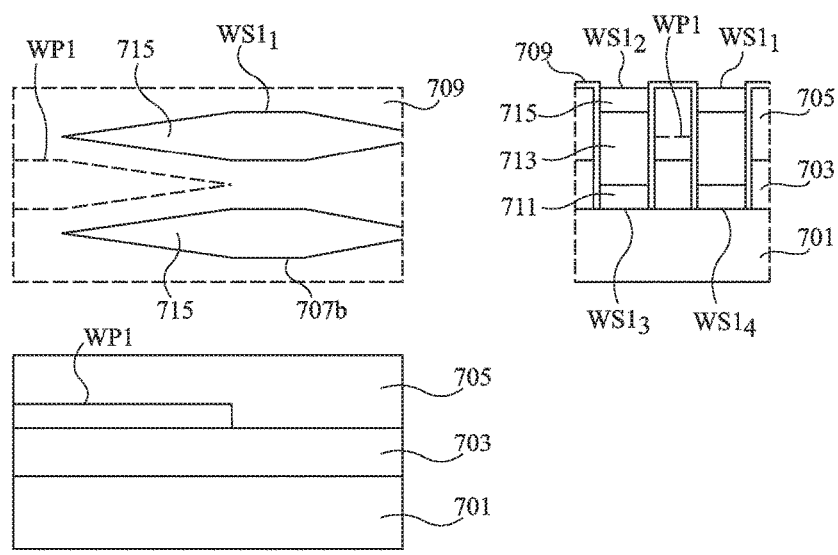

FIG. 7D illustrates a step subsequent to the step of FIG. 7C, during which are successively deposited in trenches 707a, 707b, for example, by epitaxy, a first indium-gallium arsenide layer 711 forming lower secondary waveguides $WS1_4$ and $WS1_3$ of the coupling structure respectively in trenches 707a and 707b, an indium phosphide layer 713, and a second indium gallium arsenide layer 715 forming upper secondary waveguides $WS1_1$ and $WS1_2$ of the coupling structure respectively in trenches 707a and 707b.

Specific embodiments have been described. Various alterations, modifications, and improvements will occur to those skilled in the art. In particular, the described embodiments are not limited to the above-mentioned examples of dimensions and materials.

Further, the described embodiments are not limited to the above-described examples where the coupling structure comprises two or four secondary guides. More generally, an increase in the tolerance to alignment errors may be obtained as soon as the coupling structure comprises at least two secondary guides.

Further, the described embodiments are not limited to the above-mentioned examples where the coupling structure comprises waveguides having a rectangular cross-section. More generally, the embodiments apply whatever the shape of the waveguides of the coupling structure. As an example, the waveguides of the coupling structure may have a circular or elliptic cross-section.

Further, although only examples where the provided coupling structure is used to couple the photonic circuit to which it is integrated with another photonic circuit have been described, the described embodiments are not limited to this specific application. Indeed, the described coupling structures may be used to couple a photonic circuit with another optical device, for example, an optical fiber.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising first and second photonic circuits, each one of the first and second photonic circuits comprising a structure of coupling to an outer device, the structure comprising:

a main waveguide having a rectangular transverse cross-section; and four secondary waveguides, each secondary waveguide having a first portion substantially parallel to the main guide arranged in the vicinity of the main guide to perform an evanescent wave coupling between the main guide and the secondary guide, the first portion extending in a second portion having an end opposite to the first portion defining a coupling surface of the secondary guide, emerging at the level of an external surface of the circuit, wherein the first portions of the four secondary guides are, in transverse cross-section, arranged around the main guide on the diagonals of the main guide, and wherein the coupling surfaces of the four secondary guides of the first circuit are respectively placed against the coupling surfaces of the four secondary guides of the second circuit.

2. The device of claim 1, wherein, in at least one of the first and second circuits, each secondary guide has a tapered end on the side of its coupling surface.

3. The device of claim 1, wherein, in at least one of the first and second circuits, the coefficients of coupling between the main guide and each of the secondary guides are substantially identical.

4. The device of claim 1, wherein, in at least one of the first and second circuits, the first portions of the secondary guides are substantially at an equal distance from the main guide.

5. The device of claim 1, wherein, in at least one of the first and second circuits, the maximum center-to-center distance between two secondary guides at the level of their coupling surfaces is substantially equal to twice the radius of the light beam propagated by each secondary guide at the level of its coupling surface.

6. The device of claim 1, wherein, in at least one of the first and second circuits, along their first portions, the secondary guides progressively widen to reach a maximum width at the level of their second portions.

7. The device of claim 1, wherein, in at least one of the first and second circuits, along the first portions of the secondary guides, the main guide progressively thins down.

8. The device of claim 1, wherein, in at least one of the first and second circuits, the main guide stops before the external surface of the circuit.

9. The device of claim 1, wherein, in at least one of the first and second circuits, the main waveguide and the secondary waveguides are made of silicon-germanium and are surrounded with silicon.

10. The device of claim 1, wherein, in at least one of the first and second circuits, the main waveguide and the secondary waveguides are made of amorphous silicon and are surrounded with silicon oxide.

11. The device of claim 10, wherein, in at least one of the first and second circuits, the main waveguide forms an extension of a waveguide internal to the circuit, the internal waveguide being made of crystal silicon.

12. The device of claim 1, wherein at least one of the first and second circuits comprises an integrated laser source, the main waveguide of said at least one of the first and second circuits being coupled to the laser source.

13. The device of claim 1, wherein at least one of the secondary guides of the first circuit is made of a different material than the corresponding secondary guide of the second circuit.

14. The device of claim 1, wherein:
the first circuit integrates a laser source made up of III-V semiconductor materials, the main guide of the first circuit being coupled to said laser source; and
the main guide and the secondary guides of the second circuit are made of silicon-germanium surrounded with silicon, or of silicon surrounded with silicon oxide.

* * * * *